United States Patent
Dong et al.

(10) Patent No.: US 12,057,176 B2
(45) Date of Patent: Aug. 6, 2024

(54) 3D NAND MEMORY DEVICE AND CONTROL METHOD THEREOF

(71) Applicant: YANGTZE MEMORY TECHNOLOGIES CO., LTD., Hubei (CN)

(72) Inventors: Zhipeng Dong, Hubei (CN); Ke Liang, Hubei (CN); Liang Qiao, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 84 days.

(21) Appl. No.: 17/931,764

(22) Filed: Sep. 13, 2022

(65) Prior Publication Data

US 2024/0087654 A1    Mar. 14, 2024

(51) Int. Cl.
     *G11C 16/08*      (2006.01)
     *G11C 16/24*      (2006.01)
     *G11C 16/26*      (2006.01)
     *G11C 16/30*      (2006.01)

(52) U.S. Cl.
     CPC .............. *G11C 16/26* (2013.01); *G11C 16/08* (2013.01); *G11C 16/24* (2013.01); *G11C 16/30* (2013.01)

(58) Field of Classification Search
CPC ......... G11C 16/26; G11C 16/08; G11C 16/24; G11C 16/30
USPC .................................................. 365/189.011
See application file for complete search history.

(56) References Cited

U.S. PATENT DOCUMENTS

| 2018/0218775 A1* | 8/2018 | Kim ........................ G11C 16/16 |
| 2023/0162795 A1* | 5/2023 | Choi ....................... G11C 16/08 |
|  |  | 365/185.17 |

* cited by examiner

*Primary Examiner* — Ly D Pham
(74) *Attorney, Agent, or Firm* — Sterne, Kessler, Goldstein & Fox P.L.L.C.

(57) ABSTRACT

The present disclosure provides a method for controlling a 3D NAND memory using a read operation. The method can include increasing a voltage to a plurality of top select gates, with respect to a first reference voltage level, during a pre-pulse period of the read operation prior to a read period of the read operation. The method can also include increasing a voltage to a plurality of word lines, with respect to a second reference voltage level, during the pre-pulse period. The method can also include decreasing a voltage to a bit line, with respect to the first voltage, during the pre-pulse period. The method can also include applying no voltage change to a bottom select gate during the pre-pulse period.

20 Claims, 8 Drawing Sheets

3D NAND MEMORY DEVICE AND CONTROL METHOD THEREOF

TECHNICAL FIELD

The present disclosure generally relates to the field of semiconductor technology, and more particularly, to a method for controlling a 3D NAND memory.

BACKGROUND

As memory devices are shrinking to smaller die size to reduce manufacturing cost and increase storage density, scaling of planar memory cells faces challenges due to process technology limitations and reliability issues. A three-dimensional (3D) memory architecture can address the density and performance limitation in planar memory cells.

In a 3D NAND flash memory, many layers of memory cells can be stacked vertically such that storage density per unit area can be greatly increased. The vertically stacked memory cells can form memory strings, where the channels of the memory cells are connected in each memory string. Each memory cell can be addressed through a word line and a bit line. Data (i.e., logic states) of the memory cells in an entire memory page sharing the same word line can be read or programmed simultaneously. However, due to aggressive scaling, reliability can be a concern for a 3D NAND flash memory.

BRIEF SUMMARY

Embodiments of methods and systems for data protection in a memory device are described in the present disclosure.

In some embodiments, a method can include controlling a memory device using a read operation. The method can include increasing a voltage to a plurality of top select gates, with respect to a first reference voltage level, during a pre-pulse period of the read operation prior to a read period of the read operation. The method can also include increasing a voltage to a plurality of word lines, with respect to a second reference voltage level, during the pre-pulse period. The method can also include decreasing a voltage to a bit line, with respect to the first voltage, during the pre-pulse period. The method can also include applying no voltage change to a bottom select gate during the pre-pulse period.

In some embodiments, the read operation can be a first read operation. The pre-pulse period can be a first pre-pulse period. A second pre-pulse period can be defined for a second read operation. The second read operation can differ from the first read operation in that the second read operation does not perform the decreasing of the voltage to the bit line. The method can also include setting the first pre-pulse period to be less than the second pre-pulse period.

In some embodiments, the decreasing of the voltage to the bit line can include decreasing the voltage to the bit line by greater than 0.1 volts and less than approximately 4.0 volts, 0.5 volts and less than approximately 3.0 volts, or greater than 1.0 volts and less than approximately 2.5 volts.

In some embodiments, the method can also include increasing the voltage to the bit line so as to exceed the first reference voltage level during the read period. The method can also include increasing a voltage to the bottom select gate, with respect to the first reference voltage level, during the read period.

In some embodiments, the method can also include setting a voltage, with respect to the second reference voltage level, to a selected one of the plurality of word lines to a read voltage during the read period. The bit line is associated with the selected one of the plurality of word lines. The method can also include reading from a memory cell associated with the selected one of the plurality of word lines.

In some embodiments, the method can also include decreasing a voltage to unselected ones of the top select gates during the read period. The method can also include increasing voltages to word lines next to the selected one of the plurality of word line during the read period.

In some embodiments, the memory device can be a 3D NAND memory device. The read operation can be performed to verify stored data in a memory cell of the 3D NAND memory device after programming the memory cell.

In some embodiments, a memory device can use a read operation method that reduces overall read time. The memory device can include memory cells that can store data. The memory device can also include a memory controller that can control the memory device. The memory device can also include a non-transitory computer-readable medium having instructions stored thereon, that, when executed by the memory controller, cause the memory controller to perform a read operation. The read operation can also include increasing a voltage to a plurality of top select gates, with respect to a first reference voltage level, during a pre-pulse period of the read operation prior to a read period of the read operation. The read operation can also include increasing a voltage to a plurality of word lines, with respect to a second reference voltage level, during the pre-pulse period. The read operation can also include decreasing a voltage to a bit line, with respect to the first voltage, during the pre-pulse period. The read operation can also include applying no voltage change to a bottom select gate during the pre-pulse period.

In some embodiments of the memory device, the read operation can be a first pre-pulse period. The pre-pulse period can be a first pre-pulse period. A second pre-pulse period can be defined for a second read operation. The second read operation can differ from the first read operation in that the second read operation does not perform the decreasing of the voltage to the bit line. The first read operation can also include setting the first pre-pulse period to be less than the second pre-pulse period.

In some embodiments of the memory device, the decreasing of the voltage to the bit line can include decreasing the voltage to the bit line by greater than 0.1 volts and less than approximately 4.0 volts, 0.5 volts and less than approximately 3.0 volts, or greater than 1.0 volts and less than approximately 2.5 volts.

In some embodiments of the memory device, the read operation can also include increasing the voltage to the bit line so as to exceed the first reference voltage level during the read period. The read operation can also include increasing a voltage to the bottom select gate, with respect to the first reference voltage level, during the read period.

In some embodiments of the memory device, the read operation can also include setting a voltage, with respect to the second reference voltage level, to a selected one of the plurality of word lines to a read voltage during the read period. The bit line is associated with the selected one of the plurality of word lines. The read operation can also include reading from a memory cell associated with the selected one of the plurality of word lines.

In some embodiments of the memory device, the read operation can also include decreasing a voltage to unselected ones of the top select gates during the read period. The read operation can also include increasing voltages to word lines next to the selected one of the plurality of word lines during the read period.

In some embodiments of the memory device, the memory device can be a 3D NAND memory device. The read operation can be performed to verify stored data in a memory cell of the 3D NAND memory device after programming the memory cell.

In some embodiments, a memory system can use a read operation method that reduces overall read time. The memory system can include a memory device. The memory device can include memory cells that can store data. The memory device can also include a memory controller that can control the memory device. The memory device can also include a non-transitory computer-readable medium having instructions stored thereon, that, when executed by the memory controller, cause the memory controller to perform a read operation. The read operation can include increasing a voltage to a plurality of top select gates, with respect to a first reference voltage level, during a pre-pulse period of the read operation prior to a read period of the read operation. The read operation can also include increasing a voltage to a plurality of word lines, with respect to a second reference voltage level, during the pre-pulse period. The read operation also includes decreasing a voltage to a bit line, with respect to the first voltage, during the pre-pulse period. The read operation can also include applying no voltage change to a bottom select gate during the pre-pulse period.

In some embodiments of the memory system, the read operation can be a first read operation. The pre-pulse period can be a first pre-pulse period. A second pre-pulse period can be defined for a second read operation. The second read operation can differ from the first read operation in that the second read operation does not perform the decreasing of the voltage to the bit line. The first read operation can also include setting the first pre-pulse period to be less than the second pre-pulse period.

In some embodiments of the memory system, the decreasing of the voltage to the bit line can include decreasing the voltage to the bit line by greater than 0.1 volts and less than approximately 4.0 volts, 0.5 volts and less than approximately 3.0 volts, or greater than 1.0 volts and less than approximately 2.5 volts.

In some embodiments of the memory system, the read operation can also include increasing the voltage to the bit line so as to exceed the first reference voltage level during the read period. The read operation can also include increasing a voltage to the bottom select gate, with respect to the first reference voltage level, during the read period.

In some embodiments of the memory system, the read operation can also include setting a voltage, with respect to the second reference voltage level, to a selected one of the plurality of word lines to a read voltage during the read period. The bit line is associated with the selected one of the plurality of word lines. The read operation can also include reading from a memory cell associated with the selected one of the plurality of word lines.

In some embodiments of the memory system, the read operation can also include decreasing a voltage to unselected ones of the top select gates during the read period. The read operation can also include increasing voltages to word lines next to the selected one of the plurality of word lines during the read period.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure, or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures, or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and can, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer there between. Moreover, "above" or "over" not only means "above" or "over" something, but can also include the meaning it is "above" or "over" something with no intermediate feature or layer there between (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, there above, and/or there below. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the terms "about" or "approximately" indicate the value of a given quantity that can vary based on a particular technology node associated with the subject semiconductor device. Based on the particular technology node, the terms "about" or "approximately" can indicate a value of a given quantity that varies within, for example, 10-30% of the value (e.g., ±10%, ±20%, or 30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

Figure 1:
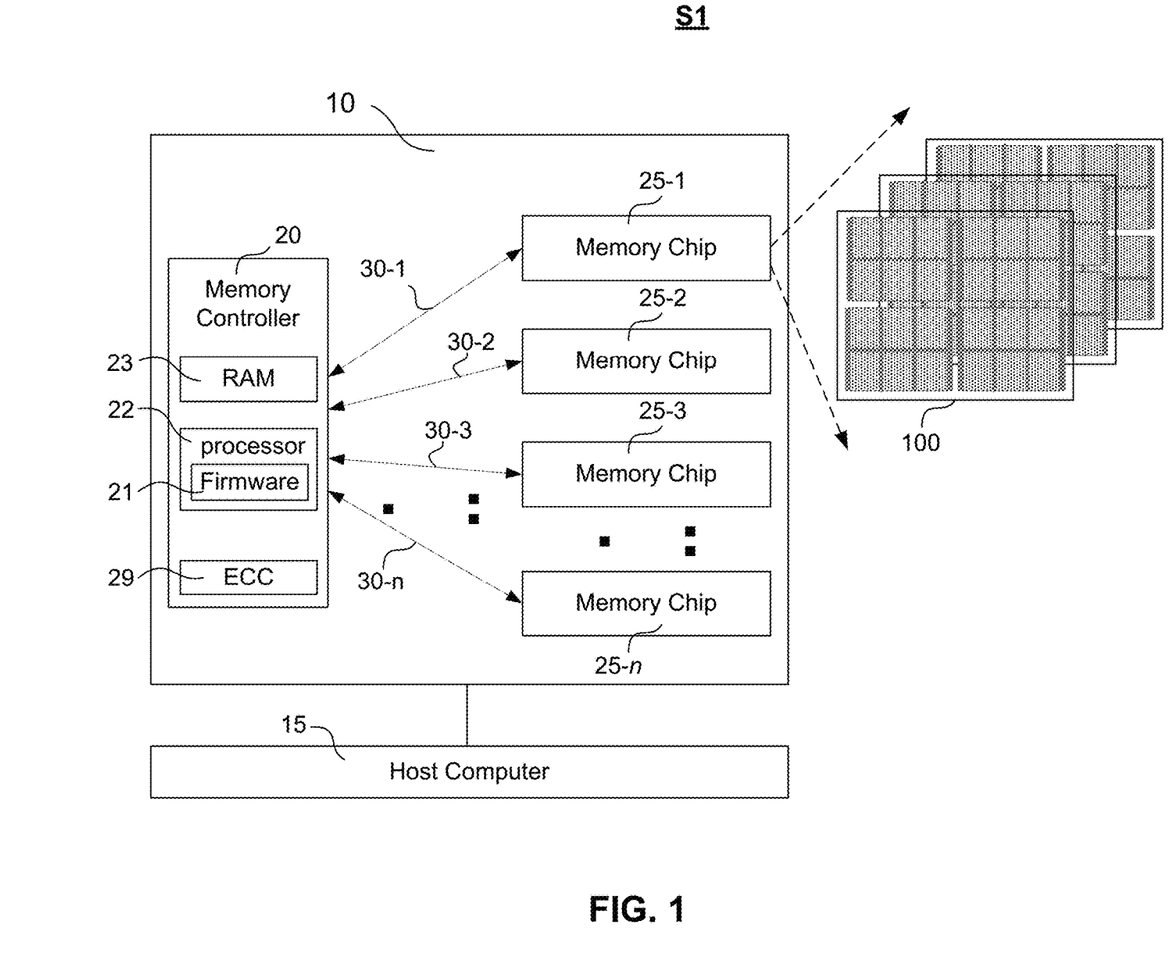
FIG. 1 illustrates a system with one or more memory chips, according to some embodiments.

FIG. 1 illustrates a block diagram of an electronic system S1, according to some embodiments. In some embodiments, electronic system S1 can include a storage system 10. Electronic system S1 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. Storage system 10 (e.g., a NAND storage system) can include a memory controller 20 and one or more semiconductor memory chips 25-1, 25-2, 25-3, . . . , 25-n. Each semiconductor memory chip 25 (hereafter just "memory chip") can be a NAND chip (e.g., "flash," "NAND flash" or "NAND"). Storage system 10 can communicate with a host computer 15 through memory controller 20, where memory controller 20 can be connected to one or more memory chips 25-1, 25-2, 25-3, . . . , 25-n, via one or more memory channels 30-1, 30-2, 30-3, . . . , 30-n. In some embodiments, each memory chip 25 can be managed by memory controller 20 via one or more memory channels 30-1, 30-2, 30-3, . . . , 30-n.

In some embodiments, host computer 15 can include a processor of an electronic device, such as a central processing unit (CPU), or a system-on-chip (SoC), such as an application processor (AP). Host computer 15 can send data to be stored at storage system 10 and/or can retrieve data from stored in storage system 10.

In some embodiments, memory controller 20 can handle I/O requests received from host computer 15, ensure data integrity and efficient storage, and manage memory chip 25. To perform these tasks, memory controller 20 can run firmware 21, which can be executed by one or more processors 22 (e.g., micro-controller units, CPU) of memory controller 20. For example, memory controller 20 can run firmware 21 to map logical addresses (e.g., address utilized by the host associated with host data) to physical addresses in memory chip 25 (e.g., actual locations where the data is stored). Controller 20 also runs firmware 21 to manage defective memory blocks in the memory chip 25, where the firmware 21 can remap the logical address to a different physical address, i.e., move the data to a different physical address. The controller 20 can also include one or more memories 23 (e.g., DRAM, SRAM, EPROM, etc.), which can be used to store various metadata used by the firmware 21. In some embodiments, the memory controller 20 can also perform error recovery through an error correction code (ECC) engine 29. ECC is used to detect and correct the raw bit errors that occur within each memory chip 25.

In some embodiments, the memory channels 30 can provide data and control communication between the memory controller 20 and each memory chip 25 via a data bus. The memory controller 20 can select one of the memory chip 25 according to a chip enable signal.

In some embodiments, each memory chip 25 in FIG. 1 can include one or more memory dies 100, where each memory die can be a 3D NAND memory.

Figure 2A:
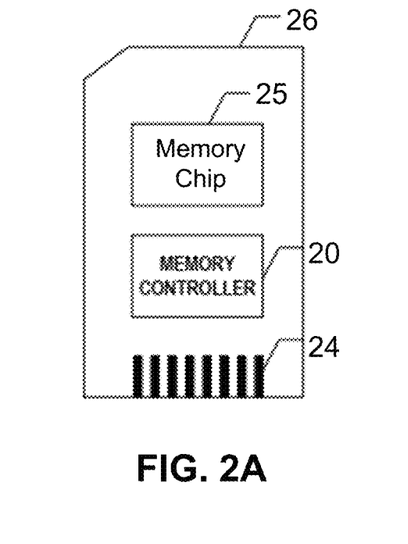
FIG. 2A illustrates a memory card, according to some embodiments.
Figure 2B:
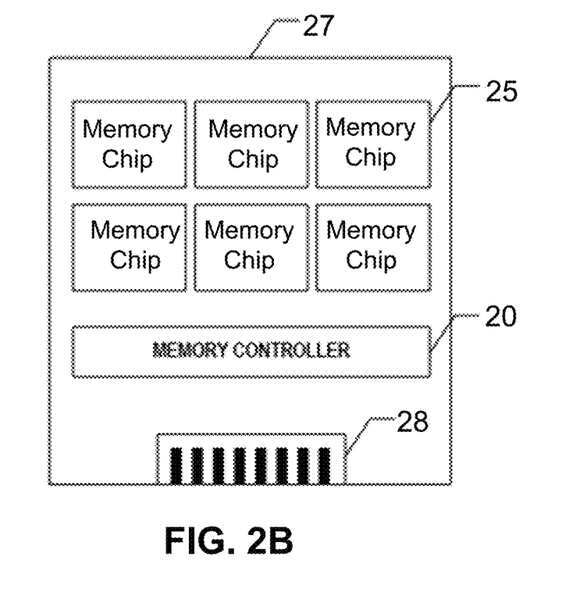
FIG. 2B illustrates a solid-state drive, according to some embodiments.

In some embodiments, memory controller 20 and one or more memory chip 25 can be integrated into various types of storage devices, for example, be included in the same package, such as a universal Flash storage (UFS) package or an eMMC package. That is, storage system 10 can be implemented and packaged into different types of end electronic products. In one example as shown in FIG. 2A, memory controller 20 and a single memory chip 25 can be integrated into a memory card 26. Memory card 26 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 26 can further include a memory card connector 24 coupling memory card 26 with a host (e.g., the host computer 15 in FIG. 1). In another example as shown in FIG. 2B, memory controller 20 and multiple memory chip 25 can be integrated into an solid state drive (SSD) 27. SSD 27 can further include an SSD connector 28 coupling SSD 27 with a host (e.g., the host computer 15 in FIG. 1).

Figure 3:
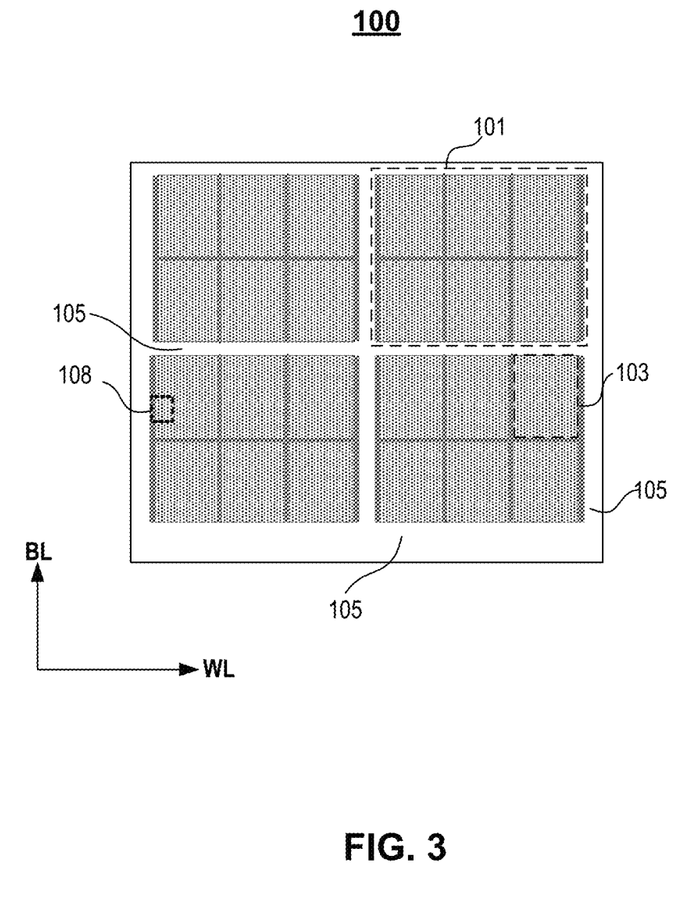
FIG. 3 illustrates a schematic diagram of a memory die, according to some embodiments.

FIG. 3 illustrates a top-down view of a memory die 100, according to some embodiments. The example configuration shown in FIG. 3 is given as a non-limiting example and it is to be appreciated that memory is scalable. In some embodiments, memory die 100 can include one or more memory planes 101, each of which can include a plurality of memory blocks 103. Identical and concurrent operations can take place at each memory plane 101. Memory block 103, which can be megabytes (MB) in size, is the smallest size to carry out erase operations. Memory die 100 can include, for example, four memory planes 101. Each memory plane 101 can include, for example, six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 3. In this disclosure, memory block 103 is also referred to as a "memory array" or "array." The memory array is the core area in a memory device, performing storage functions.

In some embodiments, memory die 100 can also include a periphery region 105, an area surrounding memory planes 101. The periphery region 105 can include many digital, analog, and/or mixed-signal circuits to support functions of the memory array, for example, page buffers, row and column decoders and sense amplifiers. Peripheral circuits use active and/or passive semiconductor devices, such as transistors, diodes, capacitors, resistors, etc., as would be apparent to a person of ordinary skill in the art.

In some embodiments, the arrangement of the memory planes 101 in the memory die 100 and the arrangement of the memory blocks 103 in each memory plane 101 illustrated in FIG. 3 are only used as an example, which does not limit the scope of the present disclosure.

Figure 4:
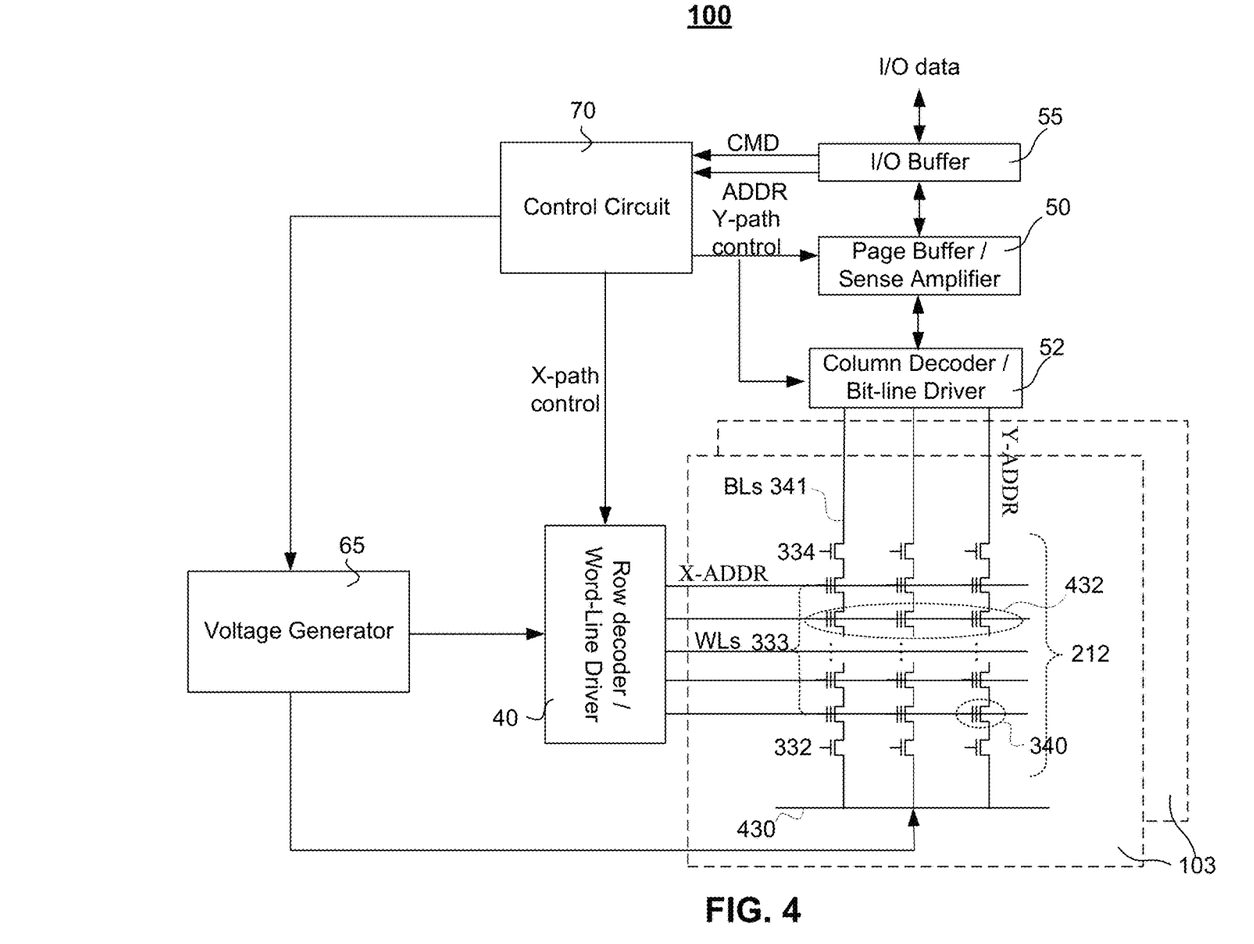
FIG. 4 illustrates a schematic of a three-dimensional (3D) memory die, according to some embodiments.

FIG. 4 illustrates a schematic diagram of the memory die 100, according to some embodiments. In some embodiments, memory die 100 can include one or more memory blocks 103 (e.g., 103-1, 103-2, 103-3). Each memory block 103 can include a plurality of memory strings 212. Each memory string 212 includes a plurality of memory cells 340. Memory cells 340 sharing the same word line forms a memory page 432. Memory string 212 can also include at least one field effect transistor (e.g., MOSFET) at each end, which is controlled by a lower select gate ("LSG") 332 and a top select gate ("TSG") 334, respectively. Lower select gates ("LSGs") can also be referred to as bottom select gates ("BSGs"). The drain terminal of the top select transistor 334-T can be connected to a bit line 341, and the source terminal of the lower select transistor 332-T can be connected to an array common source ("ACS") 430. ACS 430 can be shared by the memory strings 212 in an entire memory block, and is also referred to as the common source line.

In some embodiments, memory die 100 can also include a periphery circuit that can include many digital, analog, and/or mixed-signal circuits to support functions of the memory block 103, for example, a page buffer/sense amplifier 50, a row decoder/word line driver 40, a column decoder/bit line driver 52, a control circuit 70, a voltage generator 65 and an input/output buffer 55. These circuits can include active and/or passive semiconductor devices, such as transistors, diodes, capacitors, resistors, etc., as would be apparent to a person of ordinary skill in the art.

In some embodiments, memory blocks 103 can be coupled with the row decoder/word line driver 40 via word lines ("WLs") 333, lower select gates ("LSGs") 332 and top select gates ("TSGs") 334. Memory blocks 103 can be coupled with page buffer/sense amplifier 50 via bit lines ("BLs") 341. Row decoder/word line driver 40 can select one of the memory blocks 103 on the memory die 100 in response to a X-path control signal provided by the control circuit 70. Rrow decoder/word line driver 40 can transfer voltages provided from the voltage generator 65 to the word lines according to the X-path control signal. During the read and program operation, the row decoder/word line driver 40 can transfer a read voltage $V_{read}$ and a program voltage $V_{pgm}$ to a selected word line and a pass voltage $V_{pass}$ to an unselected word line according to the X-path control signal received from the control circuit 70.

In some embodiments, column decoder/bit line driver 52 can transfer an inhibit voltage $V_{inhibit}$ to an unselected bit line and connect a selected bit line to ground according to a Y-path control signal received from control circuit 70. In the other words, column decoder/bit line driver 52 can be configured to select or unselect one or more memory strings 212 according to the Y-path control signal from control circuit 70. The page buffer/sense amplifier 50 can be configured to read and program (write) data from and to the memory block 103 according to the control signal Y-path control from the control circuit 70. For example, the page buffer/sense amplifier 50 can store one page of data to be programmed into one memory page 432. In another example, page buffer/sense amplifier 50 can perform verify operations to ensure that the data has been properly programmed into each memory cell 340. In yet another example, during a read operation, page buffer/sense amplifier 50 can sense current flowing through the bit line 341 that reflects the logic state (i.e., data) of the memory cell 340 and amplify small signal to a measurable magnification.

In some embodiments, input/output buffer 55 can transfer the I/O data from/to the page buffer/sense amplifier 50 as well as addresses ADDR or commands CMD to the control circuit 70. In some embodiments, input/output buffer 55 can function as an interface between memory controller 20 (in FIG. 1) and memory die 100 on memory chip 25.

In some embodiments, control circuit 70 can control page buffer/sense amplifier 50 and row decoder/word line driver 40 in response to the commands CMD transferred by the input/output buffer 55. During the program operation, control circuit 70 can control row decoder/word line driver 40 and page buffer/sense amplifier 50 to program a selected memory cell. During the read operation, control circuit 70 can control row decoder/word line driver 40 and the page buffer/sense amplifier 50 to read a selected memory cell. The X-path control signal and the Y-path control signal include a row address X-ADDR and a column address Y-ADDR that can be used to locate the selected memory cell in the memory block 103. The row address X-ADDR can include a page index PD, a block index BD and a plane index PL to identify memory page 432, memory block 103, and memory plane 101 (in FIG. 3), respectively. The column address Y-ADDR can identify a byte or a word in the data of the memory page 432.

In some embodiments, voltage generator 65 can generate voltages to be supplied to word lines and bit lines under the control of control circuit 70. The voltages generated by voltage generator 65 include the read voltage $V_{read}$, the program voltage $V_{pgm}$, the pass voltage $V_{pass}$, the inhibit voltage $V_{inhibit}$, etc.

It is noted that the arrangement of the electronic components in the storage system 10 and the memory die 100 in FIGS. 1, 2A-2B, and 3-4 are shown as non-limiting examples. In some embodiments, storage system 10 and memory die 100 can have other layout and can include additional components. Components (e.g., control circuit 70, I/O buffer 55) on memory die 100 shown in FIG. 4 can also be moved off memory die 100, as a stand-alone electric component in the storage system 10. Components (e.g., control circuit 70, I/O buffer 55) on memory die 100 shown in FIG. 4 can also be moved to other components in storage system 10, for example, a portion of control circuit 70 can be combined with memory controller 20 and vice versa.

Figure 5:
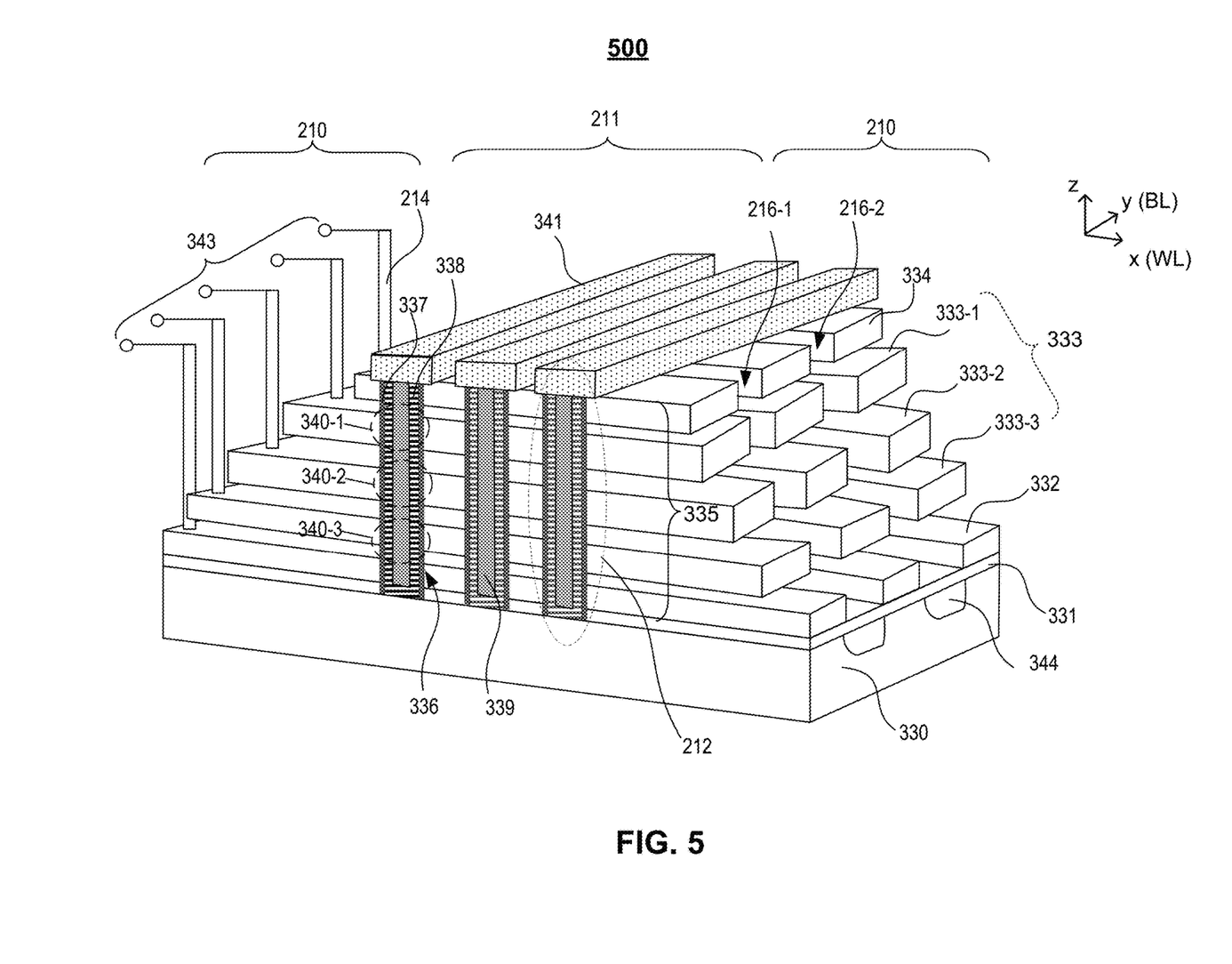
FIG. 5 illustrates a perspective view of a portion of a 3D memory structure, in accordance with some embodiments.

FIG. 5 illustrates a perspective view of a 3D memory structure 500, according to some embodiments. In some embodiments, memory die 100 can be a 3D NAND memory, and the 3D memory structure 500 can be a portion of memory die 100, for example, in a region 108 in FIG. 3. The 3D memory structure 500 can include a staircase region 210 and a channel structure region 211. Channel structure region 211 can include a plurality of memory strings 212, each including a plurality of stacked memory cells 340. Staircase region 210 can include a staircase structure.

In some embodiments, the 3D memory structure 500 can include a substrate 330, an insulating film 331 over the substrate 330, a tier of lower select gates (LSGs) 332 over the insulating film 331, and a plurality of tiers of control gates 333, also referred to as "word lines (WLs)," stacking on top of the LSGs 332 to form a film stack 335 of alternating conductive and dielectric layers. The dielectric layers adjacent to the tiers of control gates are not shown in FIG. 5 for clarity.

In some embodiments, the control gates of each tier are separated by slit structures 216-1 and 216-2 through the film stack 335. The 3D memory structure 500 can also include a tier of top select gates (TSGs) 334 over the stack of control gates 333. The stack of TSG 334, control gates 333 and LSG 332 can also be referred to as "gate electrodes." The 3D memory structure 500 can further include doped source line regions 344 in portions of substrate 330 between adjacent LSGs 332. Each of memory strings 212 of the 3D memory structure 500 can include a channel hole 336 extending through the insulating film 331 and the film stack 335 of alternating conductive and dielectric layers. Memory string 212 can also include a memory film 337 on a sidewall of the channel hole 336, a channel layer 338 over memory film 337, and a core filling film 339 surrounded by channel layer 338. Memory cell 340 (e.g., 340-1, 340-2, 340-3) can be formed at the intersection of the control gate 333 (e.g., 333-1, 333-2, 333-3) and memory string 212. A portion of channel layer 338 can respond to the respective control gate and is also referred to as channel 338 of the memory cell. The 3D memory structure 500 further includes a plurality of bit lines (BLs) 341 connected with the memory strings 212 over the TSGs 334. The 3D memory structure 500 can also include a plurality of metal interconnect lines 343 connected with the gate electrodes through a plurality of contact structures 214. The edge of film stack 335 is configured in a shape of staircase to allow an electrical connection to each tier of the gate electrodes.

In FIG. 5, for illustrative purposes, three tiers of control gates 333-1, 333-2, and 333-3 are shown together with one tier of TSG 334 and one tier of LSG 332. In this example, each memory string 212 can include three memory cells 340-1, 340-2 and 340-3, corresponding to control gates 333-1, 333-2 and 333-3, respectively. In some embodiments, the number of control gates and the number of memory cells can be more than three to increase storage capacity. The 3D memory structure 500 can also include other structures, for example, TSG cut, common source contact (i.e., array common source) and dummy memory string. These structures are not shown in FIG. 5 for simplicity. It is noted that the 3D memory structure 500 shown in FIG. 5 is only used as an example, which does not limit the scope of the present disclosure, and any other suitable 3D memory structure can also be adapted.

Referring back to FIG. 4, in some embodiments, memory block 103 can be formed based on floating gate technology. In some embodiments, the memory block 103 can be formed based on charge trapping technology. The NAND flash memory based on charge trapping can provide high storage density and high intrinsic reliability. Storage data in the form of logic states ("states," e.g., threshold voltages $V_{th}$ of the memory cell 340) depends on the number of charge carriers trapped in the memory film 337 of the memory cell 340.

In some embodiments, in a NAND flash memory, a read operation and a write operation (also referred to as program operation) can be performed for the memory page 432, and an erase operation can be performed for the memory block 103.

In some embodiments, in a NAND memory, the memory cell 340 can be in an erased state ER or a programmed state P1. Initially, memory cells 340 in memory block 103 can be reset to the erased state ER as logic "1" by implementing a negative voltage difference between control gates 333 and channel 338 such that trapped charge carriers in the memory film of memory cells 340 can be removed. For example, the negative voltage difference can be induced by setting control gates 333 of memory cells 340 to ground, and applying a high positive voltage (an erase voltage $V_{erase}$) to ACS 430. At the erased state ER ("state ER"), the threshold voltage $V_{th}$ of memory cells 340 can be reset to the lowest value.

In some embodiments, during programming (i.e., writing), a positive voltage difference between control gates 333 and channel 338 can be established by, for example, applying a program voltage $V_{pgm}$ (e.g., a positive voltage pulse between 10 V and 20 V) on control gate 333, and grounding the corresponding bit line 341. As a result, charge carriers (e.g., electrons) can be injected into the memory film of memory cell 340, thereby increasing the threshold voltage $V_{th}$ of memory cell 340. Accordingly, memory cell 340 can be programmed to the programmed state P1 ("state P1" or logic "0").

In some embodiments, the state of the memory cell (e.g., state ER or state P1) can be determined by measuring or sensing the threshold voltage $V_{th}$ of the memory cell. During a read operation, a read voltage $V_{read}$ can be applied on control gate 333 of the memory cell and current flowing through the memory cell can be measured at bit line 341. A pass voltage $V_{pass}$ can be applied on unselected word lines to switch on unselected memory cells.

In some embodiments, a NAND flash memory can be configured to operate in a single-level cell (SLC) mode. To increase storage capacity, a NAND flash memory can also be configured to operate in a multi-level cell (MLC) mode, a triple-level cell (TLC) mode, a quad-level cell (QLC) mode, or a combination of any of these modes. In the SLC mode, a memory cell stores 1 bit and has two logic states ("states"), logic {1 and 0}, i.e., states ER and P1. In the MLC mode, a memory cell stores 2 bits, and has four logic states, logic {11, 10, 01, and 00}, i.e., states ER, P1, P2, and P3. In the TLC mode, a memory cell stores 3 bits, and has eight logic states, logic {111, 110, 101, 100, 011, 010, 001, 000}, i.e., states ER, and states P1-P7. In the QLC mode, a memory cell stores 4 bits and has 16 logic states. Memory controller 20 of storage system 10 (see FIG. 1) can convert data received from host computer 15 into corresponding logic states of the memory cells on memory dies 100 and vice versa.

Figure 6:
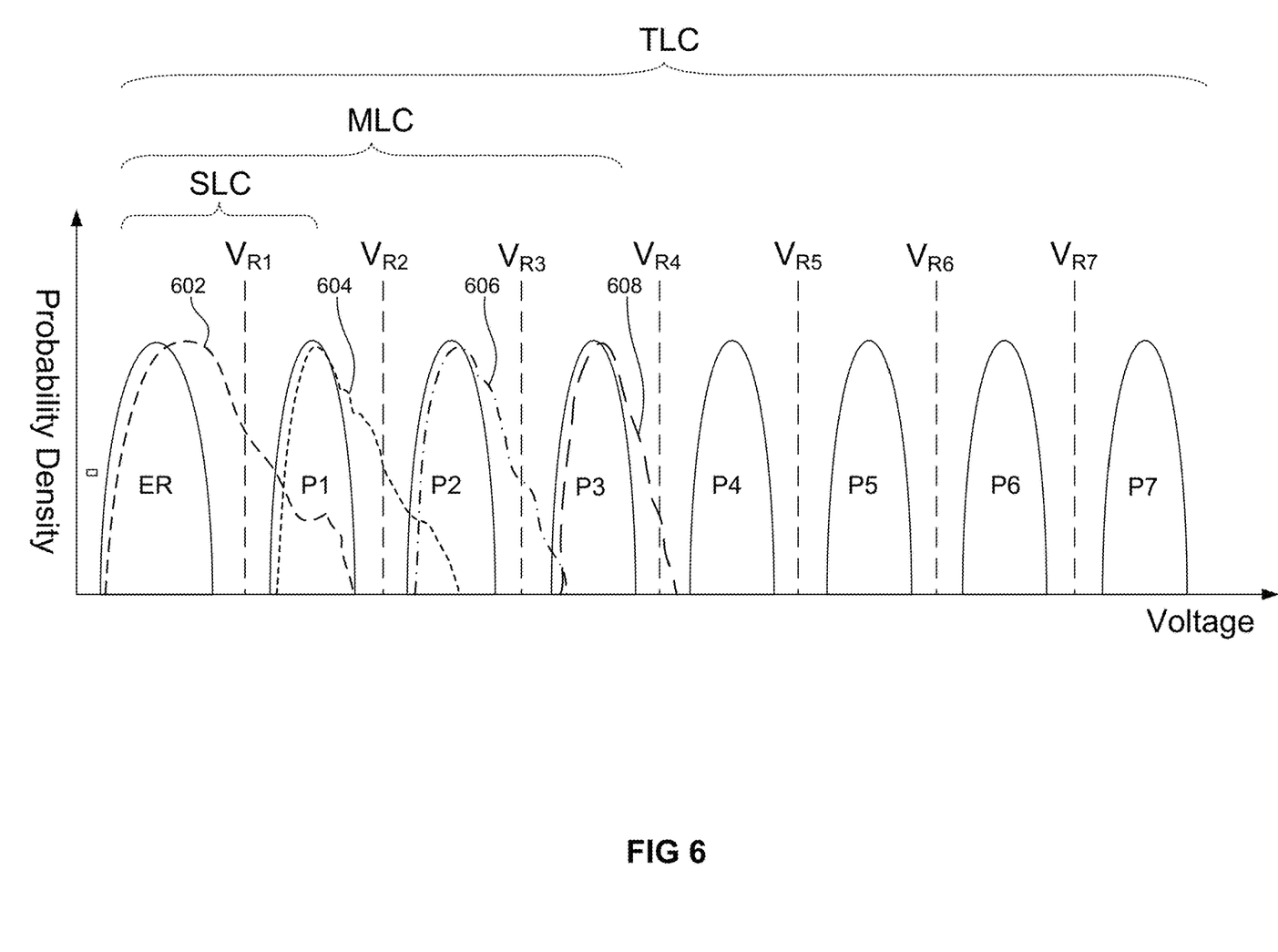
FIG. 6 illustrates a threshold voltage $V_{th}$ distribution of a NAND flash memory, according to some embodiments.

FIG. 6 illustrates a threshold voltage $V_{th}$ distribution of a NAND flash memory programmed in the triple-level cell (TLC) mode, according to some embodiments. In some embodiments, each state of the memory cells can correspond to a specific range of threshold voltage $V_{th}$, where the threshold voltage $V_{th}$ distribution of each state can be represented by a probability density. In some embodiments, the eight TLC states can be programmed by using an incremental step pulse programming (ISPP) scheme where the programming voltage $V_{pgm}$ can be incrementally increased by adding a step pulse $V_{step}$. Accordingly, the eight TLC states can be programmed from the state P1 with a lower threshold voltage to the state P7 with a highest threshold voltage.

In some embodiments, after programming, the eight TLC states ER and P1-P7 can be verified by using one or more read reference voltages $V_{R1}$-$V_{R7}$ during a verification process. By applying one or more of the read reference voltages $V_{R1}$-$V_{R7}$ to the control gate of a target memory cell, the range of the memory cell's threshold voltage $V_{th}$ can be determined. For example, to verify if a memory cell is at state ER, the read reference voltage $V_{R1}$ can be used. If the target memory cell is at state ER, the threshold voltage $V_{th}$ of the target memory cell is lower than the read reference voltage $V_{R1}$. The target memory cell can be switch on and form a conductive path in the channel. If the target memory cell is at any one of the states P1-P7, the threshold voltage $V_{th}$ of the target memory cell is higher than the read reference voltage $V_{R1}$. The target memory cell is thereby switched off. By measuring or sensing the current through the target memory cell at the corresponding bit line, via the page buffer/sense amplifier 50, the threshold voltage $V_{th}$ or the state of the target memory cell can be verified.

In some embodiments, as described above, to determine the two states ER and P1 stored in the SLC mode, it is sufficient to rely on just the read reference voltage $V_{R1}$. To determine the four states ER and P1-P3 in the MLC mode, the read reference voltages $V_{R1}$, $V_{R2}$ and $V_{R3}$ can be used. To determine the eight states ER and P1-P7 for the TLC mode, the read reference voltages $V_{R1}$-$V_{R7}$ can be used. For example, in the TLC mode, the threshold voltage of state ER is below $V_{R1}$, and the threshold voltage of state P7 is above $V_{R7}$, where the threshold voltages of state P1 is between $V_{R1}$ and $V_{R2}$. States P2-P6 can be determined similarly.

Above, embodiments have been described regarding structures of 3D NAND memory and functions thereof (e.g., 3D memory structure 500 (FIG. 5)). In some embodiments, it is desirable to provide reliable and expedient reading operations to retrieve stored data from memory cell(s). While errors in programming can be addressed using some of the methods described above (e.g., ECC), not all source of errors can stem from programmed data. In some embodiments, programmed data can be correctly stored in memory cell(s), but yet a read operation can fail for other reasons. Other sources of instabilities can influence a read operation, for example, temperature variations.

Referring again to FIG. 6, in some embodiments, conditions (e.g., change in temperature) of a 3D NAND can disturb the distributions of threshold voltages. For example, the distribution of threshold voltages for state ER can be disturbed as shown by distribution 602. Higher states can also be similarly disturbed. FIG. 6 shows non-limiting examples of deformations of threshold voltage distributions 604, 606, and 608 corresponding to distributions for states P1, P2, and P3 (higher states can be similarly affected). The effect can be referred to herein as "read disturb." If the effect of the read disturb is prominent enough, then the read operation can fail (e.g., reads an incorrect value, different from the value that was programmed in the memory cell). Similarly, the term "verify disturb" can refer to effects that disturb a verify operation. Verify operations are used to verify whether a programming operation was completed successfully. Verify operations may be similar to a read operation, but may also have some differences, for example, using a similar voltage scheme. These separate voltage schemes are described in more detail below. The term "read operation" can be used to describe a verify operation with differences It should be appreciated that effectors of read operations can also apply to verify operations. Therefore, the term "effectors of read operations" can also refer to effectors of verify operations. Also, a verify operation can be considered a read operation having different application of voltages as described herein.

In some embodiments, storage system 10 (FIG. 1), or subcomponents thereof, can undergo a power cycle (e.g., power down, sleep mode, wake up, or the like). When powered down or operating on limited power, memory cell(s) of the 3D NAND memory can undergo a substantial change in temperature (e.g., from well-above room temperature to near room temperature. In one non-limiting example, operating temperature can be approximately 70-100° C. and room temperature can be approximately 20-30° C. (can change depending on ambient conditions). When the 3D NAND is powered back on, the difference in temperature can exacerbate the read/verify disturb. Even if temperature difference were not so pronounced, read/verify disturb can still be exacerbated by a power cycle.

In some embodiments, hot carrier injection is one example phenomenon that can cause read disturbs represented by distributions 602, 604, 606, and 608. Structures of unselected WLs (e.g., WLn−1, WLn+1, WLn+) can become boosted (e.g., voltage boosted) when an adjacent selected WL (e.g., WLn) undergoes a read operation. Unless otherwise noted, the notation used herein will be such that the nth WL (WLn) is a selected WL. The notation n+/− can denote a WL spaced away from WLn. For example, the unselected WLn−1 and WLn+1 can be next to WLn. Then, the unselected WLn−2 and WLn+2 can be positioned further from WLn, and so on. Hot carrier injection can occur when a boosted bias at unselected WLs causes electrons injection in the charge trap layer of the unselected WLs. It is instructive to describe a scenario involving hot carrier injection—for example, in reference to FIG. 7.

Figure 7:
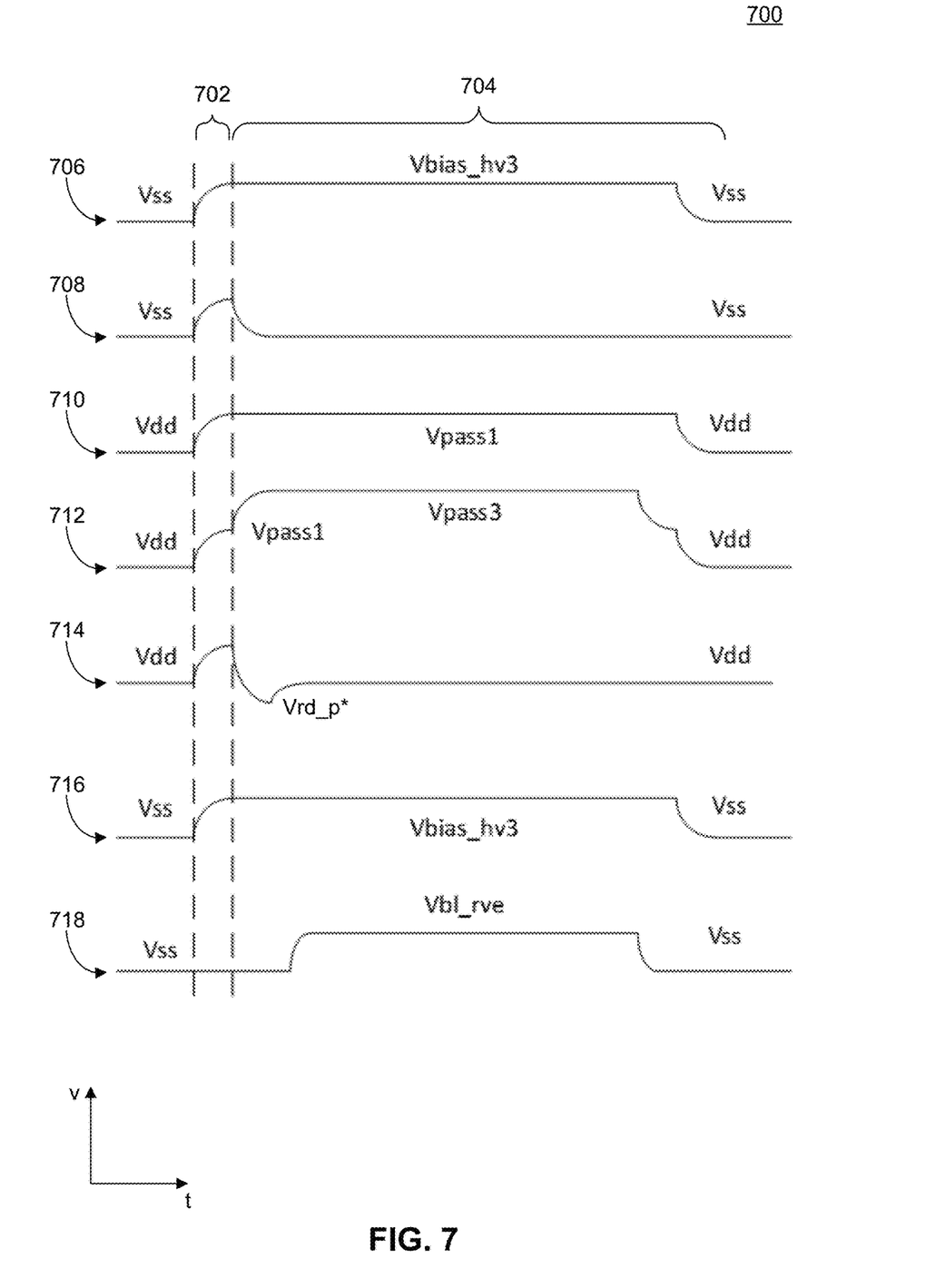
FIGS. 7 and 8 illustrate read operation methods, according to some embodiments.

FIG. 7 illustrates a read operation method 700 for reading from a 3D NAND memory, according to some embodiments. For context, some descriptions of FIG. 7 will also rely on references to elements in at least FIG. 5. In some embodiments, voltages can be applied to various structures of 3D memory structure 500 and adjusted in time. FIG. 7 is illustrated with various timelines corresponding to structures of 3D memory structure 500. The vertical axes of the timelines represent an applied voltage. The horizontal axes of the timelines represent time. Furthermore, in some embodiments, read operation method 700 can also describe a verify operation method having minor differences in the application of voltages as will be described below.

In some embodiments, the read operation method 700 can have distinct time periods. For example, the read operation method can include sending a pre-pulse voltage signal (or simply "pre-pulse") to various structures of 3D memory structure 500. The time period for the pre-pulse can be referred to as pre-pulse period 702. Similarly, the read operation method can include adjusting voltages to various structures of 3D memory structure 500 in order to read from memory cell(s) of 3D memory structure 500. The time period for reading from memory cells can be referred to as read period 704. Pre-pulse period 702 and read period 704 can be adjusted (e.g., using memory controller 20 (FIG. 1)).

In some embodiments, timeline 706 shows how a voltage can be applied to a selected one of TSGs 334. Timeline 708 shows how a voltage can be applied to unselected ones of TSGs 334. Timeline 710 shows how a voltage can be applied to unselected ones of WLs 333. Timeline 712 shows how a voltage can be applied to WLn+1 and WLn−1 (i.e., ones of WLs 333 that are next to a selected one of WLs 333). As indicated previously, the selected one of WLs 333 is denoted as WLn. Timeline 714 shows how a voltage can be applied to WLn (i.e., a selected one WLs 333). Timeline 716 shows how a voltage can be applied to a LSG 332. Timeline 718 shows how a voltage can be applied to a BL 341. It is to be appreciated that while some timelines refer to application of voltages to a single structure (e.g., a selected one of TSGs 334), the methods described herein are not so limiting. For example, memory structures can be fabricated with a plurality of memory pages and blocks. Multiple structures across the pages/blocks can be selected and/or unselected for voltage application. In another example, while a channel can be supplied a bias voltage, it is to be appreciated that other channels in the same memory page can also supplied the bias voltage. In yet another example, some it is envisaged that designs of memory structures can have a single common LSG 332 in a page or multiple LSGs 332 and that the application of voltages to a LSG 332 need not be limited to a single LSG depending on architecture.

In some embodiments, read operation method 700 can include setting a starting voltages to structures of 3D memory structure 500 before pre-pulse period 702. For example, TSGs, WLs, LSGs, and BLs can be set to voltages Vss (e.g., a first reference voltage level) or Vdd (e.g., a second reference voltage level) as shown in FIG. 7. It should be appreciated that, in some embodiments, enumerative adjectives (e.g., "first," "second," "third," or the like) can be used as a naming convention, and are not intended to indicate quantity or an order of introduction (unless otherwise noted). For example, the terms "a first reference voltage level" and "a second reference voltage level" can distinguish two reference voltage levels, but need not specify whether the first level is higher or lower than the second level. Furthermore, an element in a drawing is not limited to any particular enumerative adjective. For example, Vss can be referred to as a second reference voltage level if other voltage level(s) use appropriately distinguishing enumerative adjective(s).

In some embodiments, read operation method 700 can include increasing a voltage to a plurality of TSGs 334 during pre-pulse period 702 (see timelines 706 and 708). The voltage increase to the plurality of TSGs 334 can be with respect to Vss (e.g., a first reference voltage level). The voltage increase to the plurality of TSGs 334 can be up to a given voltage, labeled as Vbias_hv3 in FIG. 7.

In some embodiments, read operation method 700 can also include increasing a voltage to the plurality of WLs 333 during pre-pulse period 702 (see timelines 710, 712, and 714). The voltage increase to the plurality of WLs 333 can be with respect to Vdd (e.g., a second reference voltage level). The voltage increase to the plurality of WLs 333 can be up to different voltage(s). For example, unselected ones of WLs 333 can be increased up to Vpass1, which can be different from Vbias_hv3. A selected one of WLs 333 can be increased up to Vbias_hv3. It was mentioned above that read and verify operations can have minor differences in the application of voltages. For example, read operation method 700 can be altered for a verify operation by increasing the selected one of WLs 333 to Vrd_p* instead, during read period 704 (in this context, it should be appreciated that read period 704 can also be a verify period). Vrd_p* can be any of read reference voltages $V_{R1}$-$V_{R7}$ (FIG. 6), which can be positive or negative.

In some embodiments, read operation method 700 can also include increasing a voltage to a LSG 332 during pre-pulse period 702 (see timeline 716). The voltage increase to the LSG 332 can be with respect to Vss. The voltage increase to the LSG 332 can be up to, for example, Vbias_hv3. Read operation method 700 can also include applying no voltage change to a BL 341 during pre-pulse period 702 (see timeline 718).

In some embodiments, read period 704 can be defined as a period in which voltage signals are applied to structures of a NAND memory device (e.g., 3D memory structure 500) to allow sensing of stored data in memory cells of the NAND memory device. Pre-pulse period 702 can be defined as a period preceding read period 704. For example, even if voltage signals are applied during pre-pulse period 702, these applied voltage signals are not at the levels that would allow sensing of stored data in memory cells of the NAND memory device. A feature of pre-pulse period 702 is that pre-pulse signals are used for conditioning an electronic state of 3D memory structure 500 so as to avoid undesirable effects by the time the actual read is performed during read period 704. Non-limiting examples of undesirable effects include voltage floats and hot carrier injection typically arising from the voltage signals applied during read period 704. Therefore, it should be appreciated that the illustrated limits of pre-pulse period 702 and read period 704 in FIG. 7 are not limiting, but provided as an example that is consistent with the above-noted description of pre-pulse period 702 and read period 704.

In some embodiments, read operation method 700 can also include setting a voltage to a selected one of the plurality of TSGs 334 (see timeline 706) during read period 704. For example, the voltage level set in pre-pulse period 702 (Vbias_hv3) can be maintained through the transition from pre-pulse period 702 to read period 704. In other words, read operation method 700 can also include applying no voltage change to the selected one of the plurality of TSGs 334 during read period 704. Read operation method 700 can also include decreasing a voltage to unselected ones of the plurality of TSGs 334 (see timeline 708). For example, the voltage can be decreased back down to Vss at the beginning of read period 704.

In some embodiments, read operation method 700 can also include setting a voltage to unselected ones of plurality of WLs 333 during read period 704 (see timeline 710). For example, the voltage level set in pre-pulse period 702 (Vpass1) can be maintained through the transition from pre-pulse period 702 to read period 704. In other words, read operation method 700 can also include applying no voltage change to the unselected ones of the plurality of WLs 333 during read period 704. Read operation method 700 can also include increasing voltages to ones of the plurality of WLs 333 next to WLn during read period 704—that is, to WLn+1 and WLn−1 (see timeline 712). The voltage increase to WLn+1 and WLn−1 during read period 704 can be a voltage higher than Vpass1 (e.g., up to Vpass3 as shown in FIG. 7).

In some embodiments, read operation method 700 can also include setting a read voltage Vrd_p* to a selected one of plurality of WLs 333 during read period 704—that is, to WLn (see timeline 714). Vrd_p* can be any of read reference voltages $V_{R1}$-$V_{R7}$ (FIG. 6), which can be positive or negative. Read operation method 700 can also include reading from a memory cell associated with the selected one of plurality of WLs 333.

In some embodiments, read operation method 700 can also include applying no voltage change to a LSG 332 during read period 704 (see timeline 716).

In some embodiments, read operation method 700 can also include increasing the voltage to a BL 341 during read period 704 (see timeline 718). The voltage increase to the BL 341 can be performed after a brief delay during read period 704. For example, the voltage increase to BL 341 can be performed after setting voltage Vrd_p* in timeline 714. The voltage increase to the BL 341 can be up to, for example, Vbl_rve, which can be different from Vbias_hv3, Vpass1, Vpass3, and/or Vrd_p*. Vbl_rve is set such that a measureable current is present in the channel at a corresponding setting of Vrd_p*. This is how data can be sensed from a memory cell of 3D memory structure 500.

In some embodiments, after the data from 3D memory structure 500 is read, the voltages to TSGs, WLs, LSGs, and BLs can be returned to starting levels Vss or Vdd.

In some embodiments, the pre-pulse operations described above can mitigate some undesirable effects, such as voltage boosting and hot carrier injection. However, certain conditions can cause hot carrier injection even when pre-pulse is used, for example, when a NAND memory device has gone unpowered for an extended period of time (e.g., 5 minutes or more) such that hole carriers are accumulated at the charge trap layer, further boosting electrical potential for WLn+1 and above. In such cases, it is still possible that a pre-pulse can lack sufficient effect to reduce hot carrier injection to tolerable levels. One method to address this can be, for example, to increase the duration of pre-pulse period 702. However, increasing the duration of pre-pulse period 702 for multiple read operations can result in significant read latency. It is important for memory devices to store and read data precisely and quickly. In some embodiments, a read operation method is envisaged that is able to further mitigate read disturbs without relying on increasing the duration of the pre-pulse period (or at least reducing the amount by which the duration of the pre-pulse period should be increased to achieve a target reliability metric).

Figure 8:
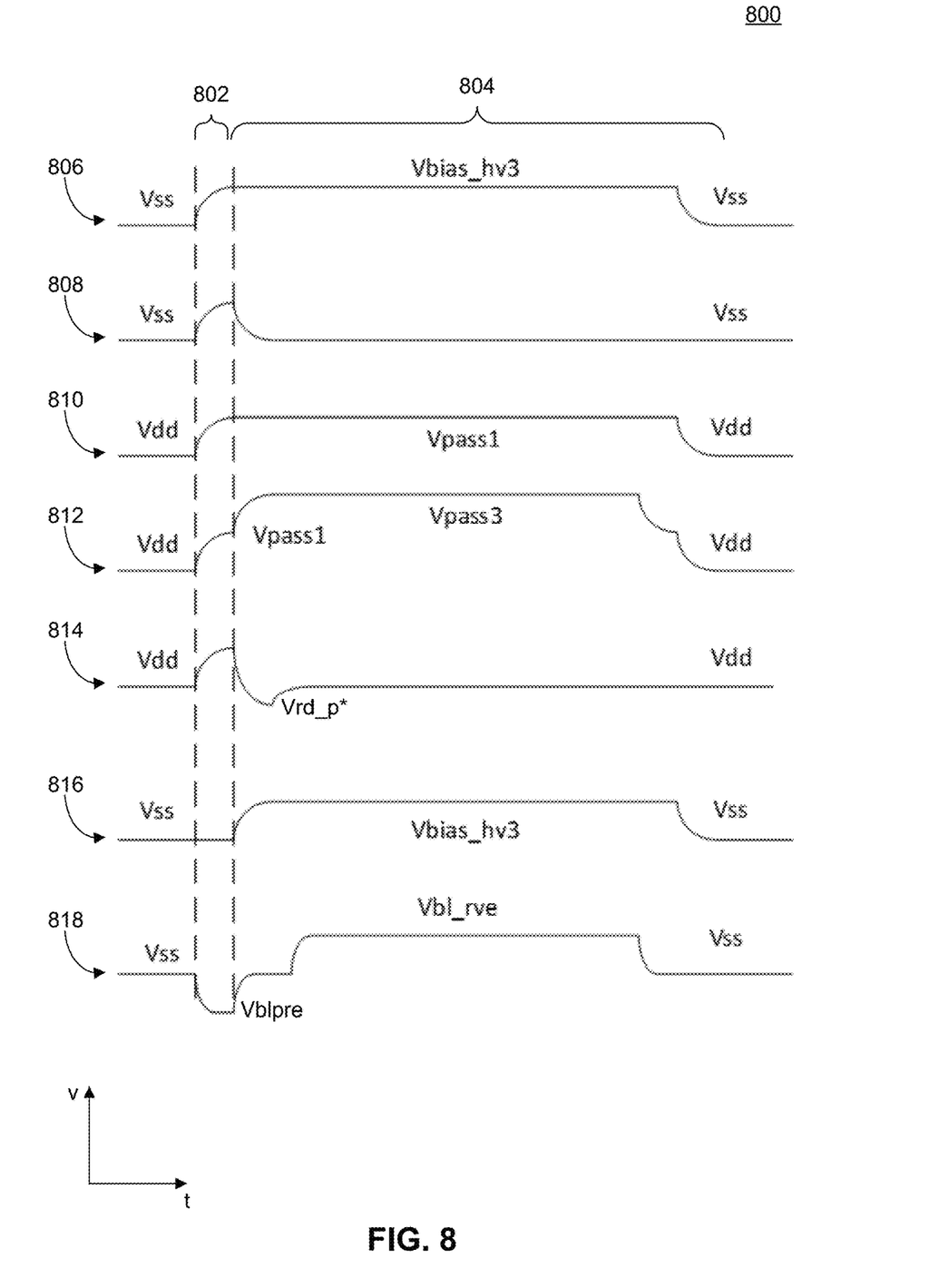

FIG. 8 illustrates a read operation method 800 for reading from a 3D NAND memory, according to some embodiments. For context, some descriptions of FIG. 8 will also rely on references to elements in at least FIG. 5. In some embodiments, voltages can be applied to various structures of 3D memory structure 500 and adjusted in time. FIG. 8 is illustrated with various timelines corresponding to structures of 3D memory structure 500. The vertical axes of the timelines represent an applied voltage. The horizontal axes of the timelines represent time.

In some embodiments, read operation method 800 as illustrated in FIG. 8 can include functions similar to read operation method 700 that were described in reference to FIG. 7. Therefore, unless otherwise noted, descriptions of elements of FIG. 8 can also apply to corresponding elements of FIG. 8 (e.g., reference numbers sharing the two rightmost numeric digits). Redundant features will not be reintroduced.

In some embodiments, the read operation method 800 can have a pre-pulse period 802 and read period 804 (e.g., adjustable using memory controller 20 (FIG. 1)). Timelines 806, 808, 810, 812, and 814 can be as described in reference to corresponding timelines 706, 708, 710, 712, and 714 (FIG. 7).

In some embodiments, read operation method 800 can include applying no voltage change to a LSG 332 during pre-pulse period 802 (see timeline 816). Read operation method 800 can also include increasing a voltage to LSG 332 during read period 804. The voltage increase to the LSG 332 can be with respect to Vss. The voltage increase to the LSG 332 can be up to, for example, Vbias_hv3.

In some embodiments, read operation method 800 can also include decreasing a voltage to a BL 341 during pre-pulse period 802 (see timeline 818). The voltage decrease to BL 341 can be with respect to Vss. The voltage decrease to BL 341 can be down to, for example, Vblpre as shown in FIG. 8. In some embodiments, a magnitude of Vblpre can be greater than approximately 0.1 volts and less than approximately 4.0 volts. In some embodiments, a magnitude of Vblpre can be greater than approximately 0.5 volts and less than approximately 3.0 volts. In some embodiments, a magnitude of Vblpre can be greater than approximately 1.0 volts and less than approximately 2.5 volts. The voltage decrease to BL 341 can reduce effects of hot carrier injection by neutralizing artificially boosted potentials in channels of unselected word lines (e.g., WLn+1, and further). Using this effect, read operation 800 can also include setting pre-pulse period 802 to be less than another pre-pulse period associated with not performing the decreasing of the voltage to BL 341.

In some embodiments, read operation method 800 can also include increasing the voltage to BL 341 during read period 804 (e.g., back to Vss). Read operation method 800 can also include further increasing voltage to BL 341 during read period 804, for example, up to Vbl_rve as described earlier in reference to FIG. 7.

In some embodiments, after the data from 3D memory structure 500 is read, the voltages to TSGs, WLs, LSGs, and BLs can be returned to starting levels Vss or Vdd.

In some embodiments, the active term "setting" can include checking whether a parameter is at a target value. If not at the target value, then "setting" can also include adjusting the parameter to the target value by increasing or decreasing the parameter value. "Setting" can also include actions without checking. For example, setting a voltage can include sending instructions to set a target voltage at a structure whether or not the structure is affected by the instructions (e.g., no change if the structure is already at the target voltage).

In some embodiments, read operations 700 and 800 can be performed using firmware 21 (FIG. 1). In some embodiments, read operations 700 and 800 can be performed to read data at the request of a host computer 15 (FIG. 1). In some embodiments, read operations 700 and 800 can use different voltages (as described above) to verify stored data in a memory cell after programming the memory cell.

The method steps in embodiments disclosed herein can be performed in any conceivable order and it is not required that all steps be performed.

In summary, the present disclosure provides a method for controlling a 3D NAND memory using a read operation. The read operation can have a pre-pulse period prior to a read period. The method includes increasing a voltage to a plurality of top select gates, with respect to a first reference voltage level, during the pre-pulse period. The method also includes increasing a voltage to a plurality of word lines, with respect to a second reference voltage level, during the pre-pulse period. The method also includes decreasing a voltage to a bit line, with respect to the first voltage, during the pre-pulse period. The method also includes applying no voltage change to a bottom select gate during the pre-pulse period. A potential boost to channels associated with unselected ones of the plurality of word lines is reduced.

The present disclosure also provides a non-transitory computer-readable medium for controlling a 3D NAND memory. The non-transitory computer-readable medium can include instructions stored thereon, that, when executed by one or more computing devices in communication with the 3D NAND memory, cause the one or more computing devices to perform a read operation having a pre-pulse period prior to a read period. The method includes increasing a voltage to a plurality of top select gates, with respect to a first reference voltage level, during the pre-pulse period. The method also includes increasing a voltage to a plurality of word lines, with respect to a second reference voltage level, during the pre-pulse period. The method also includes decreasing a voltage to a bit line, with respect to the first voltage, during the pre-pulse period. The method also includes applying no voltage change to a bottom select gate during the pre-pulse period. A potential boost to channels associated with unselected ones of the plurality of word lines is reduced.

The present disclosure further provides a system for controlling a 3D NAND memory. The system can include one or more computing devices and a non-transitory computer-readable medium. The non-transitory computer-readable medium can include instructions stored thereon, that, when executed by one or more computing devices in communication with the 3D NAND memory, cause the one or more computing devices to perform a read operation having a pre-pulse period prior to a read period. The method includes increasing a voltage to a plurality of top select gates, with respect to a first reference voltage level, during the pre-pulse period. The method also includes increasing a voltage to a plurality of word lines, with respect to a second reference voltage level, during the pre-pulse period. The method also includes decreasing a voltage to a bit line, with respect to the first voltage, during the pre-pulse period. The method also includes applying no voltage change to a bottom select gate during the pre-pulse period. A potential boost to channels associated with unselected ones of the plurality of word lines is reduced.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A computer-implemented method for controlling a memory device using a read operation, the method comprising:

increasing a voltage to a plurality of top select gates, with respect to a first reference voltage level, during a pre-pulse period of the read operation prior to a read period of the read operation;

increasing a voltage to a plurality of word lines, with respect to a second reference voltage level, during the pre-pulse period;

decreasing a voltage to a bit line, with respect to the first reference voltage level, during the pre-pulse period; and applying no voltage change to a bottom select gate during the pre-pulse period.

2. The computer-implemented method of claim 1, wherein:
the read operation is a first read operation;
the pre-pulse period is a first pre-pulse period;
a second pre-pulse period is defined for a second read operation;
the second read operation differs from the first read operation in that the second read operation does not perform the decreasing of the voltage to the bit line; and
the computer-implemented method further comprises setting the first pre-pulse period to be less than the second pre-pulse period.

3. The computer-implemented method of claim 1, wherein the decreasing of the voltage to the bit line comprises decreasing the voltage to the bit line by greater than 0.1 volts and less than approximately 4.0 volts, greater than 0.5 volts and less than approximately 3.0 volts, or greater than 1.0 volts and less than approximately 2.5 volts.

4. The computer-implemented method of claim 1, further comprising:
increasing the voltage to the bit line so as to exceed the first reference voltage level during the read period; and
increasing a voltage to the bottom select gate, with respect to the first reference voltage level, during the read period.

5. The computer-implemented method of claim 1, further comprising:
setting a voltage, with respect to the second reference voltage level, to a selected one of the plurality of word lines to a read voltage during the read period, wherein the bit line is associated with the selected one of the plurality of word lines; and
reading from a memory cell associated with the selected one of the plurality of word lines.

6. The computer-implemented method of claim 5, further comprising:
decreasing a voltage to unselected ones of the plurality of top select gates during the read period; and
increasing voltages to word lines next to the selected one of the plurality of word lines during the read period.

7. The computer-implemented method of claim 1, wherein:
the memory device is a 3D NAND memory device; and
the read operation is used to verify stored data in a memory cell of the 3D NAND memory device after programming the memory cell.

8. A memory device comprising:
memory cells configured to store data;
a memory controller configured to control the memory device; and
a non-transitory computer-readable medium having instructions stored thereon, that, when executed by the memory controller, cause the memory controller to perform a read operation comprising:
increasing a voltage to a plurality of top select gates, with respect to a first reference voltage level, during a pre-pulse period of the read operation prior to a read period of the read operation;
increasing a voltage to a plurality of word lines, with respect to a second reference voltage level, during the pre-pulse period;
decreasing a voltage to a bit line, with respect to the first reference voltage level, during the pre-pulse period; and
applying no voltage change to a bottom select gate during the pre-pulse period.

9. The memory device of claim 8, wherein:
the read operation is a first read operation;
the pre-pulse period is a first pre-pulse period;
a second pre-pulse period is defined for a second read operation;
the second read operation differs from the first read operation in that the second read operation does not perform the decreasing of the voltage to the bit line; and
the first read operation further comprises setting the first pre-pulse period to be less than the second pre-pulse period.

10. The memory device of claim 8, wherein the decreasing of the voltage to the bit line comprises decreasing the voltage to the bit line by greater than 0.1 volts and less than approximately 4.0 volts, greater than 0.5 volts and less than approximately 3.0 volts, or greater than 1.0 volts and less than approximately 2.5 volts.

11. The memory device of claim 8, wherein the read operation further comprises:
increasing the voltage to the bit line so as to exceed the first reference voltage level during the read period; and
increasing a voltage to the bottom select gate, with respect to the first reference voltage level, during the read period.

12. The memory device of claim 8, wherein the read operation further comprises:
setting a voltage, with respect to the second reference voltage level, to a selected one of the plurality of word lines to a read voltage during the read period, wherein the bit line is associated with the selected one of the plurality of word lines; and
reading from a memory cell associated with the selected one of the plurality of word lines.

13. The memory device of claim 12, wherein the read operation further comprises:
decreasing a voltage to unselected ones of the plurality of top select gates during the read period; and
increasing voltages to word lines next to the selected one of the plurality of word lines during the read period.

14. The memory device of claim 8, wherein:
the memory device is a 3D NAND memory device; and
the read operation is used to verify stored data in a memory cell of the 3D NAND memory device after programming the memory cell.

15. A memory system comprising:
a memory device comprising:
memory cells configured to store data;
a memory controller configured to control the memory device; and
a non-transitory computer-readable medium having instructions stored thereon, that, when executed by the memory controller, cause the memory controller to perform a read operation comprising:
increasing a voltage to a plurality of top select gates, with respect to a first reference voltage level, during a pre-pulse period of the read operation prior to a read period of the read operation;
increasing a voltage to a plurality of word lines, with respect to a second reference voltage level, during the pre-pulse period;
decreasing a voltage to a bit line, with respect to the first reference voltage level, during the pre-pulse period; and
applying no voltage change to a bottom select gate during the pre-pulse period.

16. The memory system of claim 15, wherein:
the read operation is a first read operation;
the pre-pulse period is a first pre-pulse period;
a second pre-pulse period is defined for a second read operation;
the second read operation differs from the first read operation in that the second read operation does not perform the decreasing of the voltage to the bit line; and
the first read operation further comprises setting the first pre-pulse period to be less than the second pre-pulse period.

17. The system of claim 15, wherein the decreasing of the voltage to the bit line comprises decreasing the voltage to the bit line by greater than 0.1 volts and less than approximately 4.0 volts, greater than 0.5 volts and less than approximately 3.0 volts, or greater than 1.0 volts and less than approximately 2.5 volts.

18. The memory system of claim 15, wherein the read operation further comprises:
increasing the voltage to the bit line so as to exceed the first reference voltage level during the read period; and
increasing a voltage to the bottom select gate, with respect to the first reference voltage level, during the read period.

19. The memory system of claim 15, wherein the read operation further comprises:
setting a voltage, with respect to the second reference voltage level, to a selected one of the plurality of word lines to a read voltage during the read period, wherein the bit line is associated with the selected one of the plurality of word lines; and
reading from a memory cell associated with the selected one of the plurality of word lines.

20. The memory system of claim 19, wherein the read operation further comprises:
decreasing a voltage to unselected ones of the plurality of top select gates during the read period; and
increasing voltages to word lines next to the selected one of the plurality of word lines during the read period.

* * * * *